United States Patent
Fujino et al.

(10) Patent No.: US 7,751,201 B2
(45) Date of Patent: Jul. 6, 2010

(54) POWER CONVERTER

(75) Inventors: Shinichi Fujino, Mito (JP); Jun Sato, Motomiya (JP); Sadashi Seto, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 289 days.

(21) Appl. No.: 11/826,981

(22) Filed: Jul. 19, 2007

(65) Prior Publication Data
US 2008/0049477 A1    Feb. 28, 2008

(30) Foreign Application Priority Data
Jul. 20, 2006   (JP) ............................. 2006-197561

(51) Int. Cl.
*H01R 9/00*   (2006.01)
*H05K 1/00*   (2006.01)

(52) U.S. Cl. ................ 361/775; 439/76.1; 439/76.2

(58) Field of Classification Search ............ 363/15, 363/16, 17, 109; 323/272; 361/688, 720, 361/736, 748, 760, 775; 439/76.1, 76.2
See application file for complete search history.

(56) References Cited

U.S. PATENT DOCUMENTS

| | | | |
|---|---|---|---|
| 4,908,738 A | | 3/1990 | Kobari et al. |
| 5,675,223 A | | 10/1997 | Yoshizawa et al. |
| 5,923,135 A | * | 7/1999 | Takeda ................. 318/432 |
| 6,060,859 A | * | 5/2000 | Jonokuchi ............. 318/801 |
| 6,114,828 A | * | 9/2000 | Matsunaga et al. ..... 318/782 |
| 6,486,632 B2 | * | 11/2002 | Okushima et al. ..... 318/599 |
| 6,841,966 B2 | * | 1/2005 | Umemura et al. ..... 318/701 |
| 7,042,722 B2 | * | 5/2006 | Suzuki et al. ......... 361/695 |
| 7,230,399 B2 | * | 6/2007 | Kuribayashi et al. ... 318/434 |
| 2001/0012212 A1 | | 8/2001 | Ikeda |
| 2006/0086981 A1 | | 4/2006 | Yamaguchi et al. |

FOREIGN PATENT DOCUMENTS

| | | |
|---|---|---|
| JP | 61-092174 | 5/1986 |
| JP | 01-248955 | 10/1989 |
| JP | 05-146151 | 6/1993 |
| JP | 05-161268 | 6/1993 |

(Continued)

OTHER PUBLICATIONS

Japanese Office Action dated Nov. 25, 2008 (Two (2) pages).

(Continued)

*Primary Examiner*—Jessica Han
*Assistant Examiner*—Emily Pham
(74) *Attorney, Agent, or Firm*—Crowell & Moring, LLP

(57) ABSTRACT

A power converter includes semiconductor device, a driver device, a current sensor, a control device, and a capacitor. The semiconductor device has a plurality of switching elements for converting a direct current to an alternating current, the direct current being supplied from a direct current terminal. The driver device controls an operation of the plurality of switching elements provided in the semiconductor device. The current sensor detects the alternating current. The control device controls an operation of the driver device in accordance with the alternating current that has been detected by the current sensor. The capacitor is connected with the direct current terminal. The driver device and the control device are mounted on the same printed board. The driver device is arranged above the semiconductor device.

20 Claims, 7 Drawing Sheets

FOREIGN PATENT DOCUMENTS

| | | |
|---|---|---|
| JP | 07-123732 | 5/1995 |
| JP | 9-182433 A | 7/1997 |
| JP | 2002-291261 A | 10/2002 |
| JP | 2004-222465 A | 8/2004 |
| JP | 2004-236391 A | 8/2004 |
| JP | 2004-282804 A | 10/2004 |
| JP | 2005-94887 A | 4/2005 |
| JP | 2005-287273 A | 10/2005 |
| JP | 2006-74853 A | 3/2006 |
| JP | 2006-121834 A | 5/2006 |
| WO | WO 00/51288 A2 | 8/2000 |

OTHER PUBLICATIONS

Chinese Office Action including English translation dated Mar. 20, 2009.
Japanese Office Action dated Apr. 7, 2009 (Five (5) sheets).
Japanese Office Action dated Aug. 18, 2009 (Two (2) sheets).
European Search Report mailed Feb. 22, 2010.

\* cited by examiner

POWER CONVERTER

BACKGROUND OF THE INVENTION

1. Field of the Invention

The present invention relates to power converters and in particular to a power converter used to control a motor for a hybrid vehicle.

2. Description of the Related Art

A power converter used to drive a motor for a hybrid vehicle or an electric vehicle supplies a driving voltage of 42 V to 600 V, which is higher than a typical load voltage of 14 V for a vehicle. Also, those power converters supply a driving current of several hundreds amperes, and accordingly it is required to reduce noise. In addition, it is necessary to suppress an increase in internal temperature due to heat generated by a semiconductor device and a capacitor.

JP-A-2005-287273 discloses a power converter having a structure capable of reducing noise, in which semiconductor devices that generate an alternating output voltage are arranged adjacent to a noise filter. In addition, JP-A-2004-282804 discloses an inverter having a structure capable of suppressing an increase in temperature, in which heat exchanger plates are provided on an upper surface of a semiconductor device, and a control device is attached to the heat exchanger plates.

SUMMARY OF THE INVENTION

In the abovementioned power converter, however, the semiconductor devices arranged adjacent to the noise filter are separately placed at two positions. In this arrangement, since a control board on which the semiconductor devices are mounted is affected by switching noise generated by the semiconductor devices, two filters are required to be provided on the control board in order to reduce noise. This causes the configuration of the circuit to be complicated. Also, noise may be amplified due to the complicated configuration of the circuit. Furthermore, since a control device is arranged adjacent to the semiconductor devices and the noise filter, the control device may be affected by heat generated by the semiconductor devices and the noise filter. This causes an excessive increase in temperature, resulting in difficulty in using the power converter for a vehicle operating at a relatively high ambient temperature.

In addition, in the abovementioned inverter, a drive circuit and a control circuit are partitioned by the heat exchanger plate. Thus, each interface circuit for the drive circuit and the control circuit is long, and the control circuit is arranged on the semiconductor device. Due to the configuration, the control device may be affected by switching noise generated by the semiconductor device. Also, this may cause an erroneous operation.

One of objects of the present invention is to provide a power converter with reduced switching noise. Another object of the present invention is to provide a power converter having a structure capable of reducing an effect of switching noise. Furthermore, it is still another object of the present invention to provide a power converter having a structure capable of suppressing an increase in temperature of the power converter and capable of being used for a vehicle or the like operating at a high ambient temperature.

In order to accomplish the abovementioned objects, a representative power converter according to the present invention comprises: a semiconductor device having a plurality of switching elements capable of converting a direct current to an alternating current, the direct current being supplied from a pair of positive and negative direct current terminals; a driver device for controlling operations of the switching elements provided in the semiconductor device; a current sensor for detecting the alternating current; a control device for controlling an operation of the driver device based on the alternating current that has been detected by the current sensor; and a capacitor connected between the direct current terminals. The driver device and the control device are mounted on the same printed board. The driver device is arranged above the semiconductor device.

Preferably, the representative power converter further comprises: an alternating current bus bar for transmitting to an alternating current terminal the alternating current that has been converted by the semiconductor device; and a capacitor bus bar used to electrically connect the direct current terminals, the capacitor and the semiconductor device. The semiconductor device, the alternating current bus bar, and the capacitor bus bar are arranged on substantially the same plane. In addition, the capacitor bus bar is placed above the capacitor, and the control device is placed above the capacitor bus bar.

Furthermore, preferably, the semiconductor device includes: a first switching element group forming an inverter unit for converting a direct current to a three phase alternating current; and a second switching element group forming a converter unit for changing a voltage between direct currents. In this case, more preferably, the semiconductor device further includes a noise filter composed of a first coil. The noise filter is connected in series between the second switching element group and a second direct current terminal which is different from the direct current terminals described above.

Furthermore, preferably, the power converter further comprises a cooling device for cooling the semiconductor device.

The present invention provides a power converter having a structure capable of reducing switching noise.

DETAILED DESCRIPTION OF THE PREFERRED EMBODIMENT

A first embodiment of the present invention will be described below in detail with reference to the accompanying drawings.

First Embodiment

Figure 1:
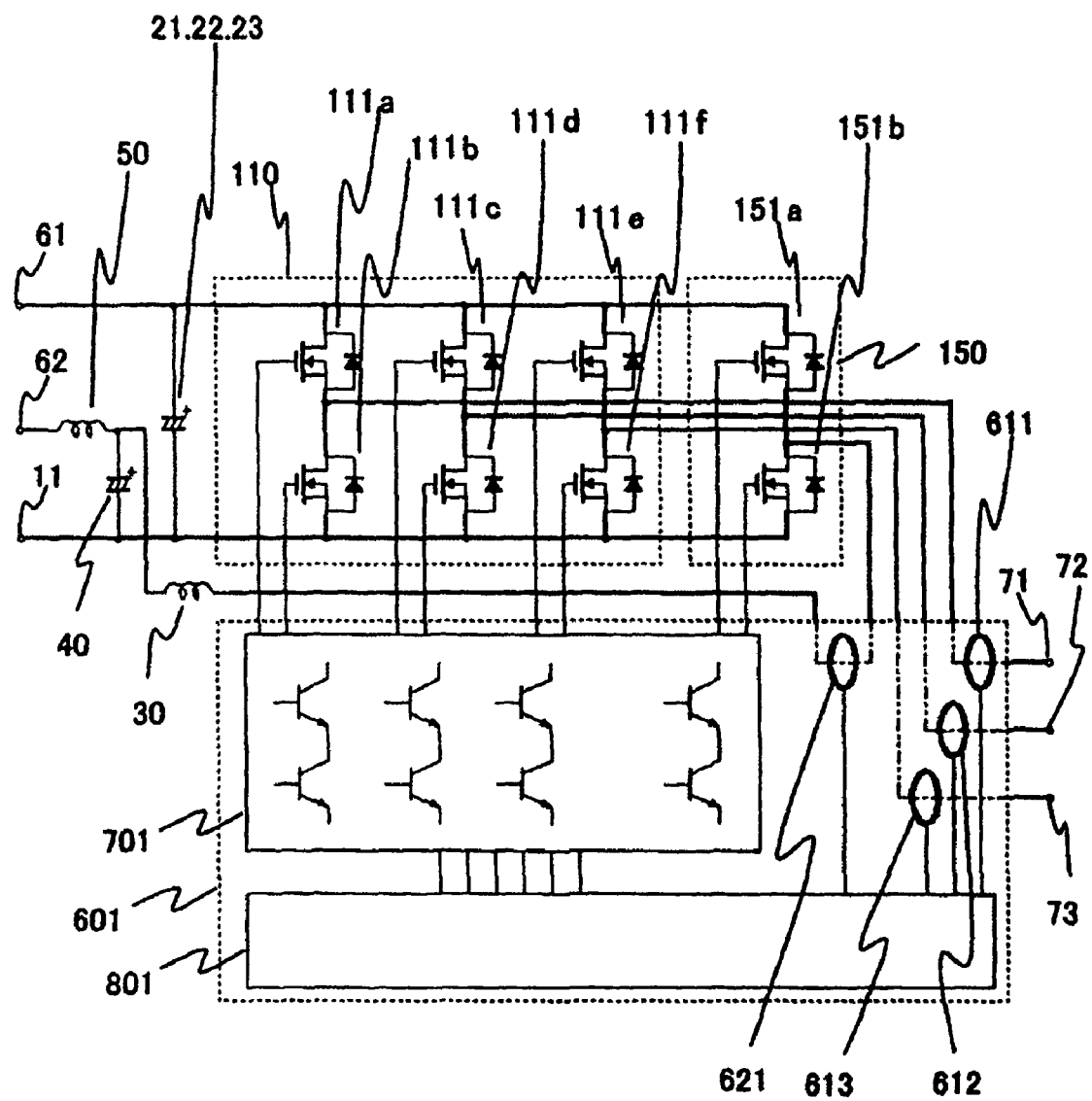
FIG. 1 is a block diagram showing the configuration of a power converter according to a first embodiment of the present invention.
Figure 2:
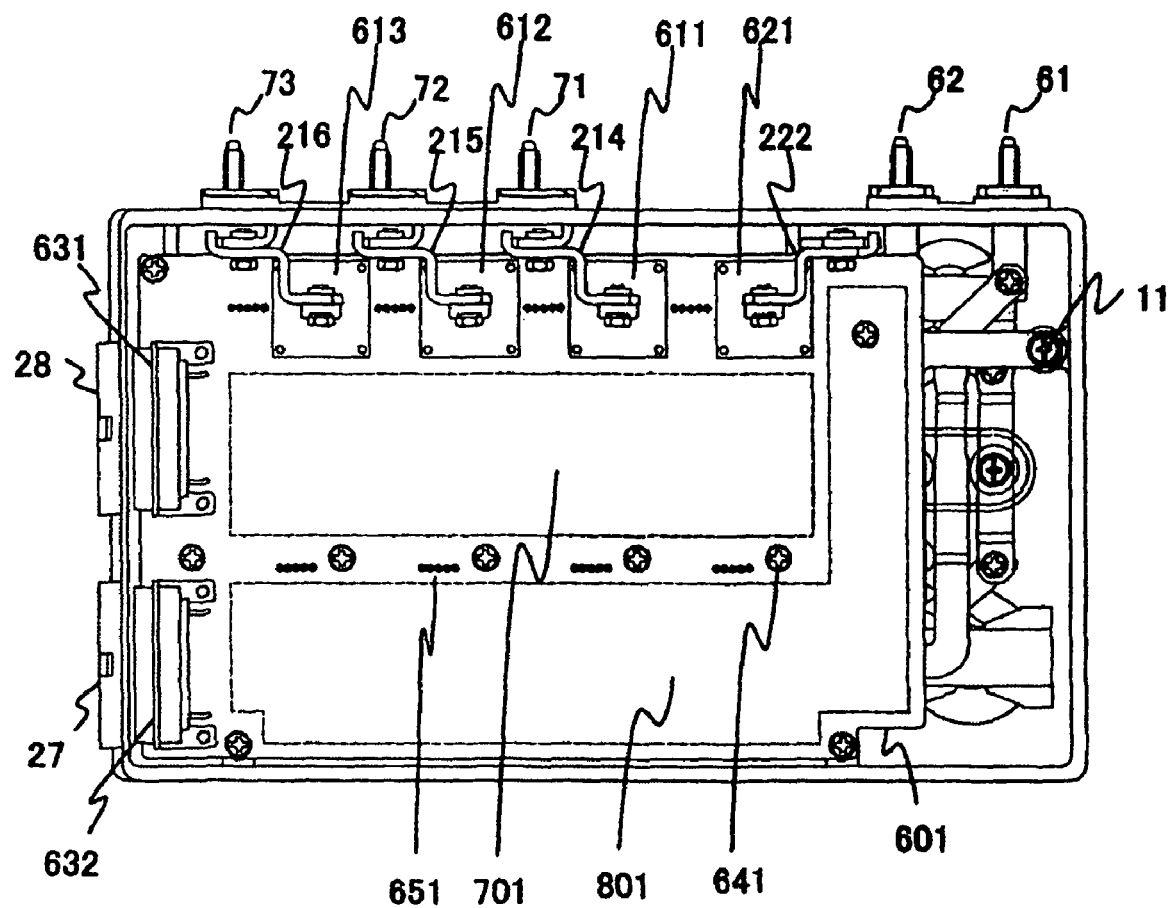
FIG. 2 is a schematic plan view showing the power converter according to the first embodiment.
Figure 3:
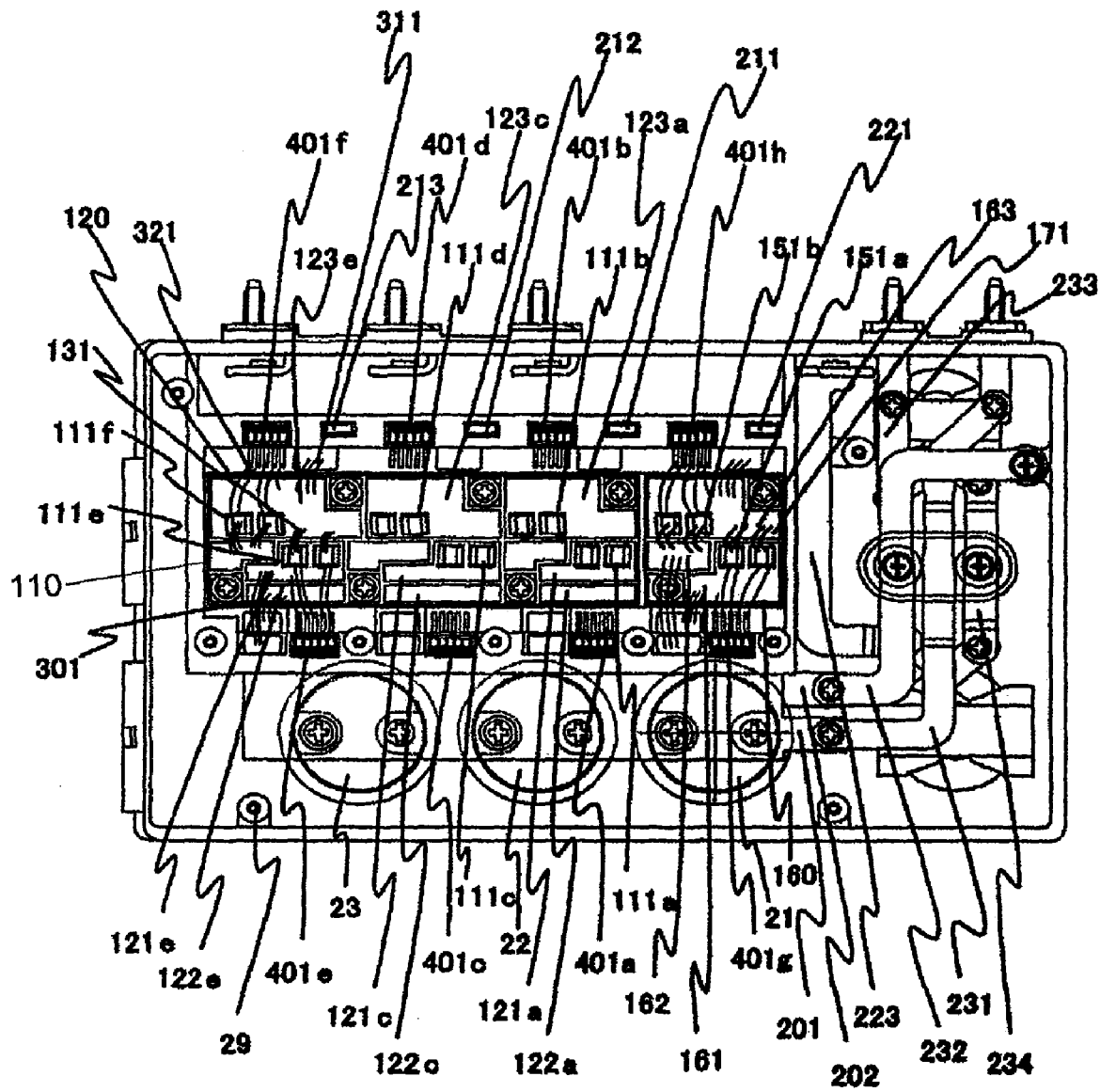
FIG. 3 is a schematic, cross-sectional, plan view showing the power converter according to the first embodiment.
Figure 4:
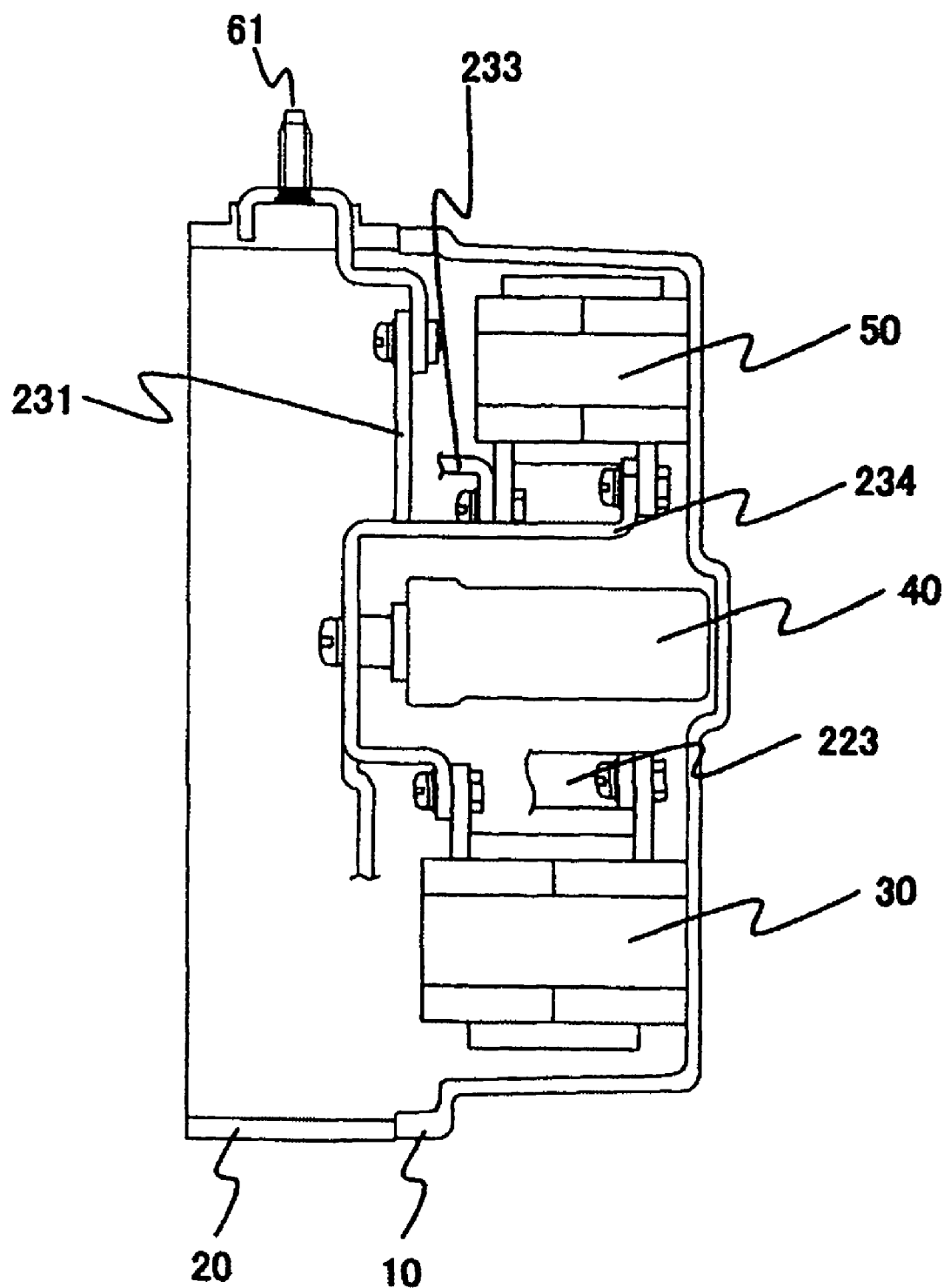
FIG. 4 is a schematic side view showing the power converter according to the first embodiment.
Figure 5:
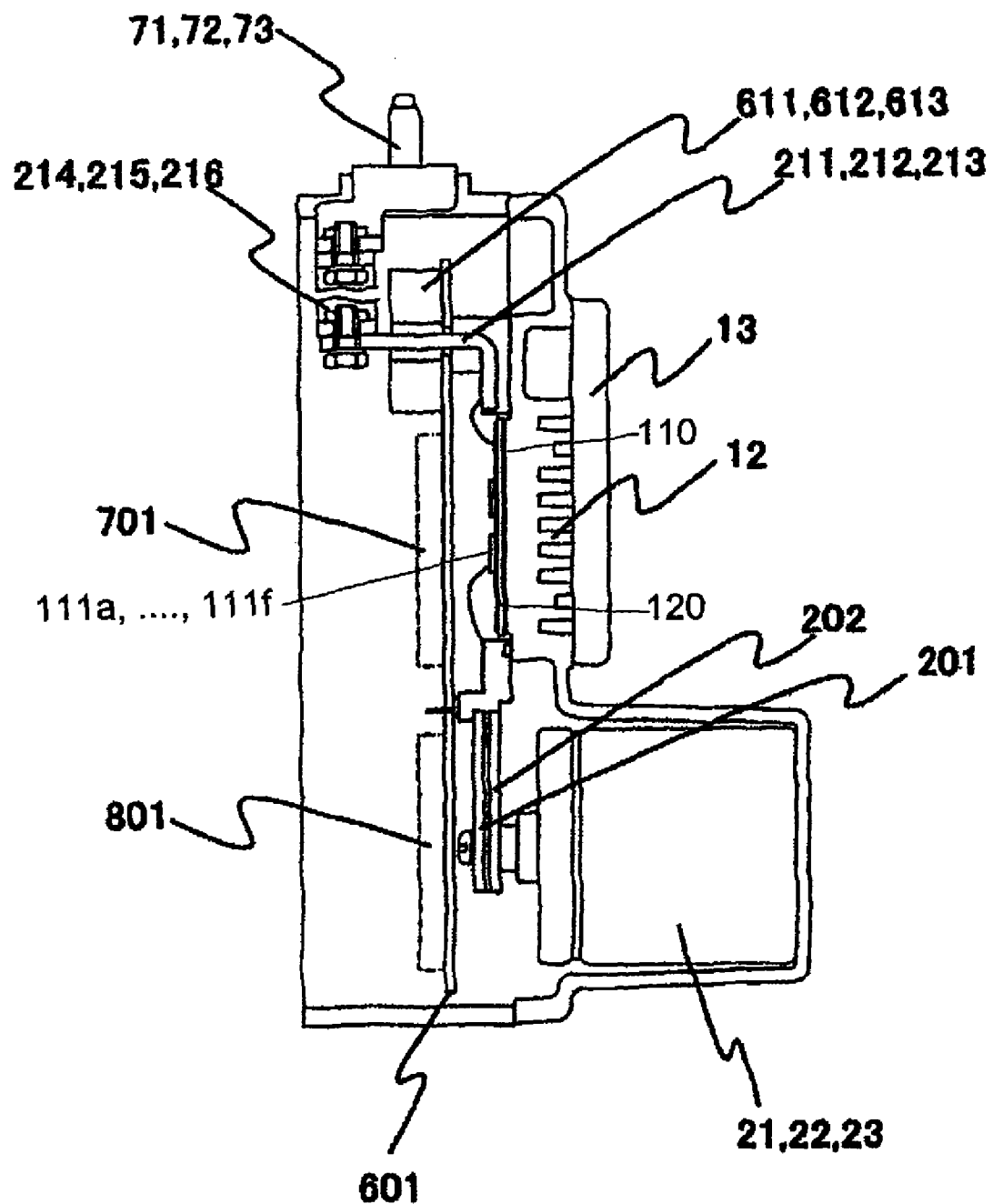
FIG. 5 is another schematic side view showing the power converter according to the first embodiment.

FIG. 1 is a block diagram showing the configuration of a power converter according to a first embodiment of the present invention. FIG. 2 is a schematic plan view showing the power converter shown in FIG. 1. FIG. 3 is a schematic, cross-sectional, plan view showing the power converter when viewed from the same direction as that in FIG. 2. FIGS. 4 and 5 are schematic side views each showing the power converter according to the first embodiment of the present invention.

In FIGS. 1 to 5, a power converter 100 includes a semiconductor motor device 110. The semiconductor motor device 110 has metal oxide semiconductor field effect transistors (MOS FETs) 111a, 111b, 111c, 111d, 111e, 111f, and a motor board 120. Each of the MOS FETs 111a, 111b, 111c, 111d, 111e, and 111f functions as a switching element. In addition, two chips, which are arranged in parallel to each other, are mounted on the motor board 120 by soldering for each of the MOS FETs 111a, 111b, 111c, 111d, 111e and 111f.

The MOS FETs 111a and 111b are connected in series in a vertical direction by use of aluminum wire lines 131 and the motor board 120 so as to form an arm. The MOS FETs 111c and 111d are connected in the same manner as the connection of the MOS FETs 111a and 111b. Also, the MOS FETs 111e and 111f are connected in the same manner as the connection of the MOS FETs 111a and 111b. Positive and negative direct current input/output sections 121a, 122a, positive and negative direct current input/output sections 121c, 122c, positive and negative direct current input/output sections 121e, 122e are provided on one side of the motor board 120. The alternating current input/output sections 123a, 123c, 123e are provided on the other side of the motor board 120. The positive and negative direct current input/output sections 121a, 122a and the alternating current input/output section 123a are provided for the arm formed by the MOS FETs 111a and 111b. Also, the positive and negative direct current input/output sections 121c, 122c and the alternating current input/output section 123c are provided for the arm formed by the MOS FETs 111c and 111d. In addition, the positive and negative direct current input/output sections 121e, 122e and the alternating current input/output section 123e are provided for the arm formed by the MOS FETs 111e and 111f.

A semiconductor converter device 150 includes MOS-FETs 151a, 151b and a converter board 160. Two chips, which are arranged in parallel to each other, are mounted on the converter board 160 by soldering for each of the MOS-FETs 151a, 151b. In addition, the MOS-FETs 151a, 151b are connected in series in the vertical direction by use of aluminum wire lines 171 and the converter board 160.

Positive and negative direct current input/output sections 161, 162 are provided on one side of the converter board 160, and an alternating current input/output section 163 is provided on the other side of the converter board 160. The motor board 120 and the converter board 160 are fixed to an aluminum die cast chassis 10 so that the positive and negative direct current input/output sections 121a, 121c, 121e, 122a, 122c, 122e, 161, 162 are placed on one side of the motor board 120 and the converter board 160 and the alternating current input/output sections 123a, 123c, 123e, 163 are placed on the other side of the motor board 120 and the converter board 160.

The direct current input/output sections 121a, 121c, 121e, 161 are connected to a positive capacitor bus bar 201. The direct current input/output sections 122a, 122c, 122e, 162 are connected to a negative capacitor bus bar 202. Aluminum wire lines 301 are used for those connections.

The alternating current input/output sections 123a, 123c, 123e are connected to alternating current bus bar 211, 212, 213 by using aluminum wire lines 311, respectively. The direct current input/output section 162 is connected to a converter bus bar 221 by using the aluminum wire lines 311.

The capacitor bus bar 201, 202, the alternating current bus bar 211, 212, 213, and the converter bus bar 221 are fixed to a resin case 20 by integral molding. The MOS FETs 111a, 111b, 111c, 111d, 111e, 111f, 151a, 151b are respectively connected to gate pins 401a, 401b, 401c, 401d, 401e, 401f, 401g, 401h by using aluminum wire lines 321 so that the MOS FETs each supply a drive signal.

It should be noted that the number of the aluminum wire lines 131, the number of the aluminum wire lines 171, the number of the aluminum wire lines 301, and the number of the aluminum wire lines 311 are not limited to the numbers as shown in FIG. 3. The numbers of the aluminum wire lines 131, 171, 301, 311 may be increased or reduced if necessary. In addition, in FIG. 3, the aluminum wire lines 131, 171, 301, 311, 321 are partially illustrated, and other parts thereof are not illustrated.

In the present embodiment, although the aluminum wire lines are used for the electrical connections, the connections are not limited to the aluminum wire lines. Instead of the aluminum wire lines, a plate-shaped metal plate(s) may be used for the electrical connections. Replacement of a part or all of the aluminum wire lines with the plate-shaped metal plate(s) makes it possible to improve the reliability of the power converter. In this case, the replacement contributes to a reduction in inductance of the power converter.

The motor board 120 may be divided for each arm or for each MOS FET. The converter board 160 may be divided for each MOS FET. Even in this case, similar effects to the first embodiment can be obtained. The motor board 120 and the converter board 160 can be configured by using a single board to obtain similar effects to the first embodiment.

The number of the chips for each of the MOS FETs 111a, 111b, 111c, 111d, 111e, 111f, 151a, 151b is not limited to two. The number of the chips for each of the MOS FETs may be increased or reduced if necessary. In addition, instead of each of the MOS FETs, a combination of an insulated gate bipolar transistor (IGBT) and a fly-wheel diode, or a bipolar transistor may be used to obtain similar effects to those in the case of the MOS FETs.

Electrolytic capacitors 21, 22, 23, an inductor 30 composed of a single phase coil, an electrolytic capacitor 40 for rectification, and a noise filter 50 composed of a single phase coil are fixed to the chassis 10. Positive terminals of the electrolytic capacitors 21, 22, 23 are connected to the positive capacitor bus bar 201, while negative terminals of the electrolytic capacitors 21, 22, 23 are connected to the negative capacitor bus bar 202.

The positive capacitor bus bar 201 is connected to a secondary positive direct current terminal 61 by using a direct current bus bar 231. The negative capacitor bus bar 202 is connected to a ground boss 11 of the chassis 10 and a negative terminal of the electrolytic capacitor 40 by using a direct current bus bar 232.

The noise filter 50 has the one end connected to a primary positive direct current terminal 62 by using a direct current bus bar 233, and has the other end connected to a positive terminal of the electrolytic capacitor 40 and the one end of the inductor 30 by using a direct current bus bar 234.

The inductor 30 has the other end connected to the converter bus bar 221 through the converter bus bar 222 and 223. Alternating current terminals 71, 72, 73 are connected to the alternating current bus bar 211, 212, 213 through alternating current bus bar 214, 215, 216, respectively.

The primary direct current terminal 62, the secondary direct current terminal 61, the alternating current terminals 71, 72, 73 are fixed to the resin case 20 by integral molding. The capacitor bus bars 201, 202, the direct current bus bars 231, 232, 233, 234, and the converter bus bar 223 are arranged on the same plane on which the motor board 120 and the converter board 160 are placed. The electrolytic capacitors 21, 22, 23, the inductor 30, the electrolytic capacitor 40, and the noise filter 50 are arranged below the motor board 120 and the converter board 160 and on the side of the chassis 10.

The electrolytic capacitors 21, 22, 23 are arranged on the side opposite to the side of the alternating current input/output sections 123*a*, 123*c*, 123*e* provided on the motor board 120 and the alternating current input/output section 163 provided on the converter board 160. The alternating current terminals 71, 72, 73 are arranged on the side of the alternating current input/output sections 123*a*, 123*c*, 123*e*, 163.

Although screws are used for the connections of each of the bus bars shown in FIG. 3, the connections thereof are not limited to the connections using the screws. In addition, the positions of the inductor 30, the electrolytic capacitor 40 and the noise filter 50 are not limited to those in the present embodiment. Also, the positions of the primary direct current terminal 62, the secondary direct current terminal 61 and the ground boss 11 of the chassis 10 are not limited to those in the present embodiment. Instead of the electrolytic capacitors 21, 22, 23 and 40, film capacitors or a combination of a film capacitor(s) and an electrolytic capacitor(s) can be used to obtain similar effects to those in the first embodiment described above.

The chassis 10 includes cooling fins 12 and a cover 13 used for a cold water path. The cooling fins 12 are molded by aluminum die casting. The cooling fins 12 are mounted on lower surfaces of the motor board 120 and the converter board 160. The chassis 10 also serves as negative poles of the primary direct current terminal and the secondary direct current terminal.

The resin case 20 is formed by resin molding and fixed to the chassis 10 to fix and insulate each of the bus bars. Instead of the cooling fins 12, air cooling fins or another cooling device may be used to obtain similar effects to those in the first embodiment.

A material having high thermal conduction such as an aluminum cast and a steel plate may be used for the chassis 10 to obtain similar effects to the present embodiment described above. Instead of providing each of the negative poles to the chassis 10, a negative terminal may be provided to the chassis 10 so that the chassis 10 is fixed to the resin case 20.

A driver device 701, a control device 801, motor current sensors 611, 612, 613, and a converter current sensor 621 are mounted on a printed circuit board (PCB) 601, which is a single printed board. The PCB 601 is fixed to a PCB boss 29 of the resin case 20 by use of screws 641 so that the PCB 601 overlaps and is parallel to a plane on which the motor board 120, converter board 160, the capacitor bus bars 201, 202, the direct current bus bars 231, 232, 233, 234, and the converter bus bar 223 are arranged. In this case, the PCB 601 may be connected with the chassis 10 at a part of fixed portions of the PCB 601 by the screws 641 or by another connection method so that the PCB 601 is grounded.

The driver device 701 is arranged to overlap the motor board 120 and the converter board 160. Also, the control device 801 is arranged to overlap the capacitor bus bars 201, 202, the direct current bus bars 231, 232, 233, 234, and the converter bus bar 223.

The motor current sensors 611, 612, 613 and the converter current sensor 621 are arranged on the side of the alternating current terminals 71, 72, 73 of the PCB 601. With this arrangement, the driver device 701 is arranged to be surrounded by the control device 801 and the motor current sensors 611, 612, 613.

The PCB 601 is connected with gate pins 401*a*, 401*b*, 401*c*, 401*d*, 401*e*, 401*f*, 401*g*, and 401*h* through pin connection holes 651 and has connectors 631, 632. The connectors 631, 632 are used for external interfaces of the control device 801. Connector housings 27 and 28, which are provided for the connectors 631 and 632 respectively, are molded to the resin case 20.

The alternating current bus bars 211, 212, 213 extend through current detection units of the motor current sensors 611, 612, 613, respectively. Also, the converter bus bar 221 extends through a current detection unit of the converter current sensor 621. The motor current sensors 611, 612, 613, the converter current sensor 621, the control device 801, the driver device 701, and the connectors 631, 632 are connected on the PCB 601.

Although an insulation type current sensor is used for each of the motor current sensors 611, 612, 613 and the converter current sensor 621, another current sensor such as a shunt resistor may be used for each of them to obtain similar effects to those in the present embodiment described above. The PCB 601 may be fixed by using another method such as caulking, instead of using the screws 641. External interfaces, which are each formed by a connector and a harness, may be used instead of using the connectors 631, 632 and the connector housings 27, 28.

The power converter 100 according to the present invention has a cooling device. Heat generated by the semiconductor motor device 110 and the semiconductor converter device 150 is transmitted to a cooling medium through the cooling fins 12 provided in the chassis 10. The heat is blocked by the resin case 20 so that it is not transmitted to the PCB 601.

Heat generated by the electrolytic capacitors 21, 22, 23, the inductor 30, the electrolytic capacitor 40, and the noise filter 50 is transmitted to the cooling medium through the cooling fins 12 provided in the chassis 10. Since the heat is blocked by the capacitor bus bars 201, 202, the direct current bus bars 231, 232, 233, 234 the converter bus bar 223 and the resin case 20, it is not transmitted to the PCB 601.

As a cooling device, a complete cooling medium path is formed in the chassis 10 so that the semiconductor motor device 110 and the semiconductor converter device 150 are arranged above the cooling medium path. With this configuration, it is possible to cool the heat. In order to the cooling efficiency, a metal base such as a copper base, which has the semiconductor motor device 110 and the semiconductor converter device 150 mounted thereon, may be directly mounted on an opening formed in the cooling medium path to completely form the cooling medium path. In this case, cooling fins can be formed on a portion of the metal base, which is in contact with the cooling medium.

This configuration makes it possible to minimize a distance between the semiconductor motor device 110, the semiconductor converter device 150 and the PCB 601, or a distance of an interface between the semiconductor motor device 110, the semiconductor converter device 150 and the driver device 701. This can reduce switching noise.

In addition, the motor current sensors 611, 612, 613, and the converter current sensor 621 are not intersected with the semiconductor motor device 110, the semiconductor converter device 150 and the driver device. Also, the control device 801 and interfaces of the abovementioned current sensors are not intersected with the semiconductor motor device 110, the semiconductor converter device 150 and the driver device. Thus, the motor current sensors 611, 612, 613, and the converter current sensor 621, the control device 801 and the interfaces are not affected by switching noise.

Therefore, it is possible to easily install the power converter according to the present invention in, for example, a vehicle that is driven by an internal combustion engine without imposing any limitation on a position at which the power converter is installed. The distance between the semiconductor motor device 110 and the PCB 601 and the distance between the semiconductor converter device 150 and the PCB 601 can be minimized to reduce the size of the power converter. This also makes it possible to easily install the power converter according to the present invention in such a vehicle.

Figure 6:
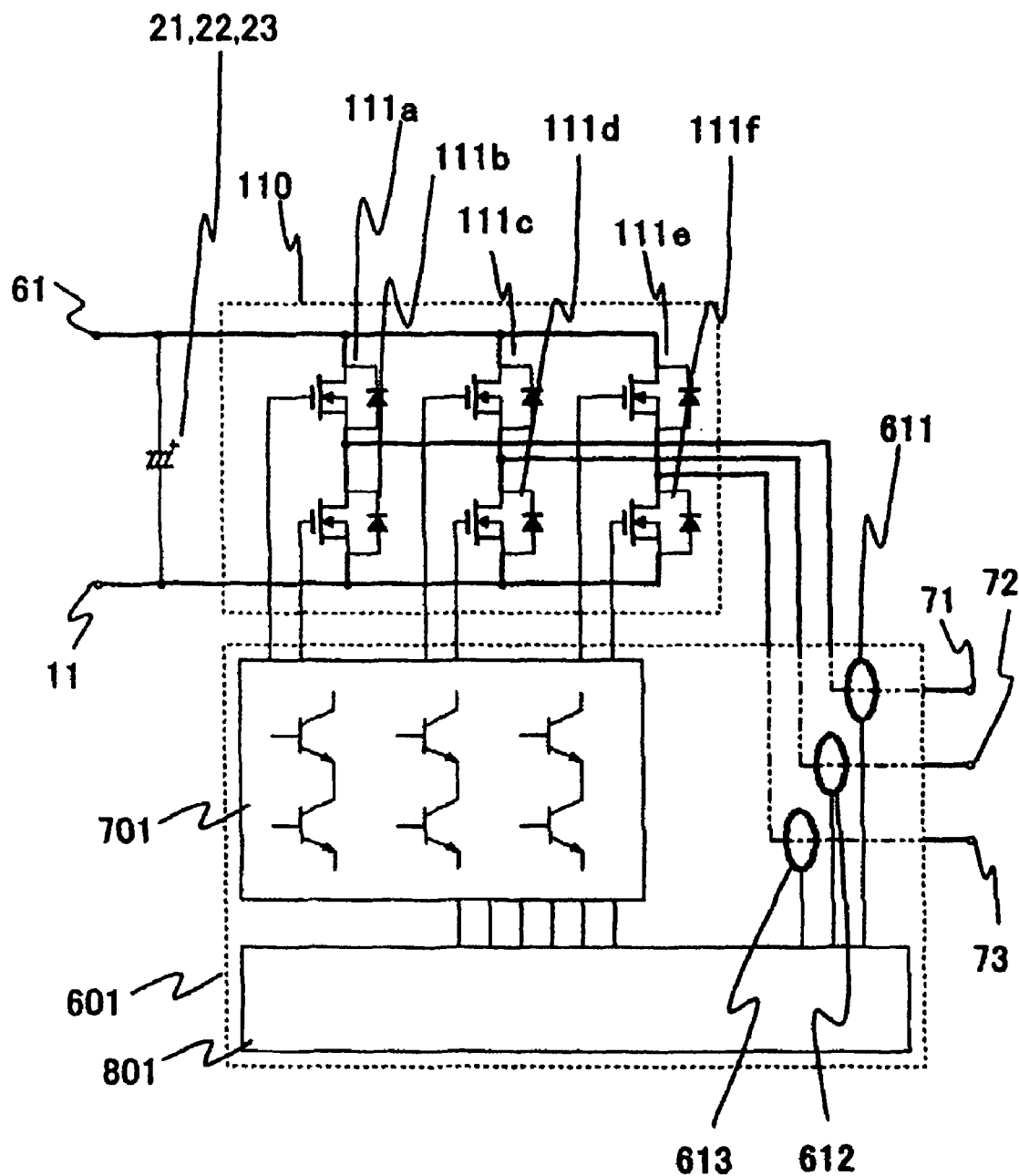
FIG. 6 is another block diagram showing the configuration of the power converter according to the first embodiment.

Next, a modification according to the first embodiment will be described below with reference to FIG. 6. FIG. 6 is a block diagram showing a power converter 100. In FIG. 6, the power converter 100 includes MOS FETs 111a, 111b, 111c, 111d, 111e, 111f, an electrolytic capacitor 21, a driver device 701, and a control device 801. Each interface and each structure of the above devices are configured similarly to those provided in the power converter 100 according to the first embodiment. The configuration shown in FIG. 6 provides similar effects to those obtained by the configuration of the power converter 100 according to the first embodiment.

Second Embodiment

Figure 7:
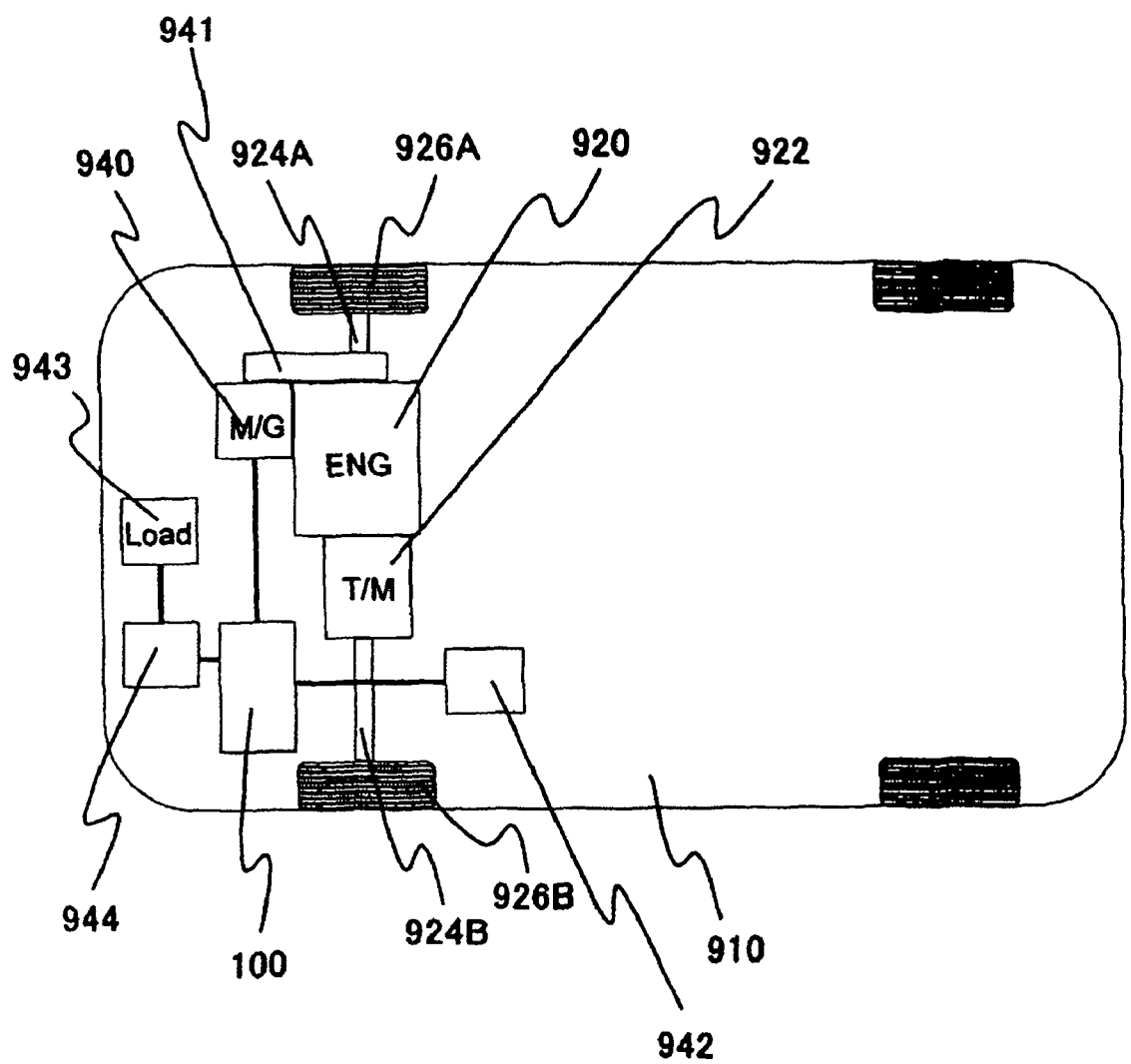
FIG. 7 is a block diagram showing the entire configuration of a vehicle with a motor generator system installed therein according to the second embodiment of the present invention.

FIG. 7 is a diagram showing a vehicle according to a second embodiment of the present invention, the vehicle having the power converter 100 according to the modification mounted therein. In FIG. 7, a vehicle 910 has an engine 920. A driving force of the engine 920 is transmitted to front wheels 926A, 926B through a transmission 922 and first front wheel shafts 924A, 924B to drive the front wheels 926A, 926B.

Although the vehicle 910 has the engine 920 which drives the front wheels 926A, 926B in the description above, the engine 920 may drive the rear wheels. Alternatively, a vehicle having six or more wheels, such as a truck, a tractor, a trailer and the like may be applied to the second embodiment.

A motor generator 940 is provided in an engine room. The motor generator 940 is composed of an alternating current motor which is coupled with the engine 920 and a belt 941. The motor generator 940 drives the engine 920 through the belt 941, or drives the front wheels 926A, 926B through a drive support, the engine 920, and the transmission 922. The engine 920 is driven through the belt 941, and the front wheels 926A, 926B are driven through the engine 920 and the transmission 922, so as to charge an in-vehicle battery 942, a power supply for other devices 943 provided in the vehicle 910, and a 12 V battery 944.

It should be noted that the motor generator 940 can generate a battery voltage (e.g., 42 V) normally higher than a voltage (e.g., 12 V) supplied from the in-vehicle battery by using, for example, a coil field type three-phase alternating current motor so as to drive the engine 920 or the front wheels 926A, 926B.

Although the motor generator 940 is coupled with the engine 920 and the belt 941, another method for the coupling, such as coupling with use of a chain, may be used. The motor generator 940 may be placed between the engine 920 and the transmission 922, or placed in the transmission 922 to obtain similar effects to those in the case where it is placed as shown in FIG. 7.

The motor generator 940, the in-vehicle battery 942, the other devices 943, and the 12 V battery 944 are connected through the power converter 100. The power converter 100 supplies power generated by the motor generator 940 to the other devices 943, the 12 V battery 944, and the in-vehicle battery 942. Also, the power converter 100 supplies power supplied from the in-vehicle battery 942 to the motor generator 940. With a motor generator system having the abovementioned configuration, the vehicle 910 has an idling stop function and a regenerative brake function to improve the fuel efficiency.

The power converter according to the present invention makes it possible to reduce switching noise. Also, the power converter according to the present invention makes it possible to reduce effects of switching noise, which suppresses an increase in temperature of the control device. Furthermore, the size of the power converter can be reduced.

The power converter according to the modification can be easily installed in, for example, a vehicle that is driven by an internal combustion engine. A vehicle, which has such a power converter installed therein, has an idling stop function and a regenerative brake function. This contributes to improve the fuel efficiency.

What is claimed is:

1. A power converter comprising:
a case;
a direct current terminal for receiving direct electric power;
a power module provided at a low portion inside of said case, and provided at one side of said case;
a capacitor arrangement provided at a low portion inside and at another side of said case;
a connecting conductor arranged along said power module and connected to said direct current terminal electrically;
a driver circuit portion arranged at the one side of the case and at upper side of said power module; and
a control circuit portion arranged at an upper side of said connecting conductor;
wherein said connecting conductor is electrically connected to said capacitor and provides a power module side connecting terminal at the side of said power module with said power module providing an outputting portion at the opposite side to the portion where the power module side connecting terminal is connected and direct power received through said direct current terminal being supplied to said power module through said power module side connecting terminal of said connecting conductor to which said capacitor arrangement is connected; and
said power module being arranged to be controlled by said driver circuit portion which is controlled by said control circuit portion, converts from the direct power supplied from said power module to AC power, and outputs from said output portion.

2. The power converter according to claim 1,
wherein said metal has a case is configured to function as a negative pole of the direct current terminal.

3. The power converter according to claim 1,
wherein said connecting conductor is arranged above said capacitor arrangement, and said control circuit portion is arranged above said connecting conductor.

4. The power converter according to claim 3,
wherein said capacitor arrangement is comprised of a row of plurality of capacitors arranged along with said power module at one row at the other side of said power module;
said connecting conductor is arranged along with and on said row of plurality of capacitors; and
said row plurality of capacitors are connected in parallel by said connecting conductor.

5. The power converter according to claim 1,
wherein said driver circuit portion and said control circuit portion are mounted on a common printed circuit board.

6. The power converter according to claim 5,
wherein said capacitor arrangement is comprised of a row of plurality of capacitors arranged along with said power module at one row at the other side of said power module;
said connecting conductor is arranged along with and on said row of plurality of capacitors; and
said row of plurality of capacitors are connected in parallel by said connecting conductor.

7. The power converter according to claim 1,
wherein said arrangement capacitor is comprised of a row of plurality of capacitors arranged along with said power module at one row at the other side of said power module;
said connecting conductor is arranged along with and on said row of plurality of capacitors; and
said row of plurality of capacitors are connected in parallel by said connecting conductor.

8. The power converter according to claim 1,
wherein said power module is configured to generate alternative output corresponding the each phase of three phase alternative current and to provide three pairs of series circuits, one of which consists of a plus side switching element and a minus side switching element in response to the three phase;
said three pairs of series circuits are connected in parallel to said connecting conductors for supplying direct electric power, respectively;
a cooling fin is provided in the opposite side with said driver circuit portion of said power module; and
a cooling passage in which said cooling fin is positive is provided in the opposite side with said driver circuit portion of said power module and along with the direction of said connecting conductor.

9. The power converter according to claim 1, further comprising:
a current sensor for detecting the alternating current,
wherein said current sensor is mounted on the printed board; and
wherein said driver circuit portion is arranged between said control circuit portion and said current sensor.

10. The power converter according to claim 9,
wherein the alternating current terminal is arranged on one side on which said current sensor mounted on the printed board is arranged so that the alternating current terminal and said current sensor are aligned in the same row; and
wherein one end of said alternating current bus bar is connected with the alternating current terminal, and the other end of said alternating current bus bar is connected with an alternating current input/output section through a current detection unit of said current sensor, the alternating current input/output section being provided for the plurality of switching elements which are provided in said power module.

11. The power converter according to claim 1,
wherein said power module has a first switching element group including an inverter unit for converting a direct current to a three-phase alternating current and a second switching element group including a converter unit for changing a voltage between direct currents.

12. A motor generator system comprising the power converter according to claim 11 in a vehicle which is driven by an internal combustion engine.

13. The power converter according to claim 7, further comprising a second current sensor for detecting a current flowing in said converter unit,
wherein said control device controls said driver device in accordance with the current which has been detected by said second current sensor.

14. The power converter according to claim 11,
wherein the first switching element group and the second switching element group each includes a plurality of metal oxide semiconductor field effect transistors.

15. The power converter according to claim 11, further comprising a noise filter composed of a first coil,
wherein said noise filter is connected in series between the second switching element group and a second direct current terminal different from the direct current terminal.

16. The power converter according to claim 15,
wherein one electrode of said noise filter is connected with the second direct current terminal by using a first direct current bus bar, and the other electrode of said noise filter is connected with one electrode of a second coil which is connected with an output section of the second switching element group by using a second direct current bus bar.

17. The power converter according to claim 16,
wherein said control device is arranged above said first and second direct current bus bars.

18. The power converter according to claim 16,
wherein said noise filter is arranged below said first and second direct current bus bars.

19. The power converter according to claim 18, further comprising a metal chassis for mounting said semiconductor device and said capacitor arrangement therein,
wherein said noise filter is arranged in said chassis.

20. The power converter according to claim 19, further comprising a plurality of alternating current terminals for outputting the three-phase alternating current which has been converted by said inverter unit,
wherein the direct current terminal, the second direct current terminal, and the plurality of alternating current terminals are arranged on a side surface of said metal chassis and in parallel to each other.

* * * * *